US008488369B2

(12) United States Patent
Chandra et al.

(10) Patent No.: US 8,488,369 B2
(45) Date of Patent: Jul. 16, 2013

(54) METHOD OF ALTERING DISTRIBUTION OF A CHOSEN CHARACTERISTIC OF A PLURALITY OF MEMORY CELLS FORMING A MEMORY DEVICE

(75) Inventors: Vikas Chandra, Fremont, CA (US); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 210 days.

(21) Appl. No.: 13/064,209

(22) Filed: Mar. 10, 2011

(65) Prior Publication Data
US 2012/0230129 A1   Sep. 13, 2012

(51) Int. Cl.
*G11C 11/00* (2006.01)
(52) U.S. Cl.
USPC .......... 365/154; 365/49.1; 365/201; 365/205; 365/207
(58) Field of Classification Search
USPC .......................... 365/154, 202, 201, 205, 207
See application file for complete search history.

(56) References Cited

U.S. PATENT DOCUMENTS

| 2003/0012067 | A1* | 1/2003 | Wong et al. | 365/201 |
| 2008/0219069 | A1* | 9/2008 | Arsovski et al. | 365/201 |

OTHER PUBLICATIONS

Jiajing Wang, Improving SRAM Vmin and Yield by Using Variation-Aware BTI Stress, 978-1-4244-5759-5/10/$26.00 (c)2010 IEEE.*
Wang et al., "Improving SRAM Vmin and Yield by Using Variation—Aware BTI Series", *IEEE*, 2010, 4 pages.
Chandra et al., "On the Efficacy of Write-Assist Techniques in Low Voltage Nanoscale SRAMs", *EDAA*, 2010, pp. 345-350.
McPherson, "Reliability Challenges for 45 nm and Beyond", *Texas Instruments, Inc.*, No Date, pp. 176-181.
Borkar, "Designing Reliable Systems from Unreliable Components: The Challenges of Transistor Variability and Degradation", *IEEE Computer Society*, 2005, pp. 10-15.
U.S. Appl. No. 12/591,751, Vikas Chandra et al., filed Nov. 30, 2009.

* cited by examiner

*Primary Examiner* — Pho M Luu
*Assistant Examiner* — Thao Bui
(74) *Attorney, Agent, or Firm* — Nixon & Vanderhye P.C.

(57) ABSTRACT

A method is provided for altering distribution of a chosen characteristic of a plurality of memory cells forming a memory device. The method comprises identifying a subset of the memory cells whose value of the chosen characteristic is within a predetermined end region of the distribution, and then performing a burn-in process during which one or more operating parameters of the memory device are set to induce aging of the memory cells. During the burn-in process, for each memory cell in the subset, the value stored in that memory cell is fixed to a selected value which exposes that memory cell to a stress condition. In contrast, for each memory cell not in the subset, the value stored in that memory cell is alternated during the burn-in process in order to alleviate exposure of that memory cell to the stress condition. Such an approach allows a tightening of the distribution of the chosen characteristic, thus improving the worst case memory cells.

13 Claims, 6 Drawing Sheets

METHOD OF ALTERING DISTRIBUTION OF A CHOSEN CHARACTERISTIC OF A PLURALITY OF MEMORY CELLS FORMING A MEMORY DEVICE

BACKGROUND OF THE INVENTION

1. Field of the Invention

The present invention relates to a method of altering the distribution of a chosen characteristic of a plurality of memory cells forming a memory device.

2. Description of the Prior Art

As process geometries shrink in modern data processing systems, the variability in certain characteristics of the individual circuit elements increases. Considering as an example a memory device consisting of an array of memory cells, it will be understood that each memory cell will typically consist of a number of electronic components such as transistors, and the variability in those individual components significantly increases as process geometries shrink. To ensure correct operation of the memory device, it is typically necessary to control the operation of the memory device having regards to the worst case characteristics of the memory cells within the device.

Furthermore, there is an increasing desire to operate data processing systems at lower and lower supply voltages, and as the supply voltage decreases, reliability issues due to the variations in the individual components become more prominent.

One example of a characteristic which exhibits such variations is the minimum supply voltage required to ensure that a memory cell can correctly store a data value during a write operation, this characteristic being referred to herein as the write Vmin characteristic. A typical write Vmin distribution in a large memory array such as an SRAM array is schematically shown in FIG. 1 by the curve 10. As shown in FIG. 1, there is a relatively long tail region 20, and as process geometries shrink this tail region becomes longer.

Such Vmin distributions can be plotted for a variety of operations within the memory array, for example a write operation, a read operation, a data retention operation, etc. As process geometries shrink to sub-50 nm processes, it is typically the case that write operations are more susceptible than other operations to failure as voltage supply is reduced, and hence the actual minimum voltage that the memory array can be operated at is determined by the tail region of the write Vmin distribution. In particular, it is necessary to set as a minimum operating voltage a voltage that will enable all memory cells to operate correctly when subjected to a write operation.

The cause of write failures will be illustrated with reference to FIG. 2, which shows a typical 6T (six transistor) memory cell. As shown in FIG. 2, a latch formed by the interconnection of transistors 20, 25, 30, 35 is used to store a single bit data value. In particular, during a write operation, one of the bit lines 50, 55 will be driven to a logic one value whilst the other bit line will be driven to a logic zero value. At the same time, a write word line pulse will be provided to the access transistors 10, 40 to turn those transistors on and thereby connect the bit lines to the latch. For a successful write operation this will cause the nodes 60, 65 to be driven to opposite logic levels to each other, to thereby encode either a logic zero value or a logic one value within the latch, dependent on the values provided on the bit lines. At the end of the write operation, the pulse provided to the access transistor 10, 40 will be de-asserted, whereafter the written value will be retained within the latch.

However, FIG. 2 illustrates an example where the write is not successful. In particular it is assumed that the current state within the latch at the start of the write operation comprises a logic 1 value at node 1 60, and a logic zero value at node 2 65. For a normal write operation, one of the bit lines (in the illustrated example bit line 50) will push a "0" value and the other bit line (in the illustrated example bit line 55) will push a "1" value. Since the access transistors 10, 40 are NMOS devices, the side pushing a "0" dominates the write (in this case, the side with the BL bitline 50). Hence, the success of the write operation will depend mainly on the relative strengths of the pull-up PMOS and access NMOS transistors (in this case, the PL 20 and AL 10 transistors). The AL transistor 10 has to be stronger than the PL transistor 20 to ensure that the write operation succeeds. The bitline BLB 55 which is trying to push a "1" also impacts the write operation as a second order effect. In this case, the relative strengths of the NR 35 and AR 40 transistors are of importance.

For a memory cell in the tail region 20 shown in FIG. 1, a problem that can arise is that, once the supply voltage is reduced, the cell cannot be flipped during the write operation. This mainly happens due to intrinsic device variability where the pull-up PMOS transistor becomes much stronger than the access NMOS transistor such that the access transistor cannot force a new value onto the relevant node of the latch. In the example shown in FIG. 2, if the PL transistor 20 becomes much stronger (has a lower threshold voltage Vt, as an example) than the AL transistor 10, the node 1 60 will not flip to "0" during the write operation illustrated, since the PL transistor 20 will strongly keep the "1" value at that node 60 This is a problem which is exacerbated at lower supply voltages. Hence, the cells in the long tail region limit the voltage scaling range due to write failure issues, and thus put a limit on write Vmin.

Various write assist schemes have been proposed to improve the SRAM write-ability (and hence lower Vmin) For example the article by V. Chandra, C. Pietrzyk and R. Aitken, entitled "On the Efficacy of Write-Assist Techniques in Low Voltage Nanoscale SRAMs," IEEE Design Automation and Test in Europe, March 2010, describes the various write assist techniques currently used in SRAM design and their trade-offs.

Effective write-assist schemes include wordline boosting and/or provision of a negative voltage bitline, which both serve to increase the strength of the access transistors relative to the transistors within the latch. Hence, considering by way of example the earlier write problem described with reference to FIG. 2, such approaches will increase the strength of the access transistor 10 relative to the pull-up PMOS transistor 20, thereby increasing writeability. However, the implementation usually requires a charge pump or other coupling based techniques to modulate voltage, both of which cause area increase. As an example, commonly owned copending U.S. patent application Ser. No. 12/591,751, the entire contents of which are hereby incorporated by reference, describes a wordline boosting approach that using a coupling based technique to modulate voltage. In addition to an undesirable increase in area, wordline boosting and negative bitline techniques can cause stability issues in half selected cells in a row (i.e. those cells subjected to an asserted wordline signal but which are not the addressed memory cells for the write operation) and in non-selected column cells respectively.

Another type of write assist scheme involves Vdd lowering and/or Vss raising, both of which weaken the transistors in the latch relative to the access transistors. These techniques are typically easier to implement with reduced area overhead when compared with wordline boosting or negative bitline techniques. However, the stability of bit cells is adversely impacted since the supply voltage or the ground nodes are modulated, thus resulting in reduction of noise margin.

Apart from the spatial variations described above with reference to FIG. 2, modern transistors also undergo temporal variations as well. As the regime of sub-45 nm technology node is entered, the stress in the devices causes them to age faster which reduces the life of the device in field. The reliability problem is touted as one of the most important concerns for future devices, see for example the article by S. Borkar entitled "Designing Reliable Systems from Unreliable Components: The Challenges of Transistor Variability and Degradation," IEEE Micro, 2005, and the article by J. W. McPherson entitled "Reliability Challenges for 45 nm and Beyond," IEEE Design Automation Conference (DAC), 2006. One of the major causes of an unreliable device is NBTI (Negative Bias Temperature Instability). NBTI is an effect where the PMOS devices get stressed at higher temperature when the gate-source bias is negative. The usual impact of NBTI is an increase in the device threshold voltage (Vt) over the life of the device. The degradation of device threshold can manifest as path delay failures. However, the shift in threshold voltage Vt is a function of the stress level on the device. A PMOS device which has a static "0" at its gate and a static "1" at its source is likely to get much more stressed than a device where the inputs (hence gate-source bias) change with time. The changing bias anneals the stress and hence it does not let the Vt degrade. A similar but reverse phenomenon happens for metal gate, high-k dielectric NMOS transistors. In this case, PBTI (Positive Bias Temperature Instability) stress impacts the NMOS devices in the design.

FIG. 3 illustrates the transistors undergoing NBTI and PBTI stress in a bit cell. In this case, the cell is holding a "1" at node 1 60 (and consequently a "0" at node 2 65). The cell could be contributing to the long tail 20 due to it being difficult to write to this cell at lower voltages. As explained above, this is due to the relative strengths of PMOS/NMOS transistors in the latch with respect to the access transistors. However, an interesting aspect to note is that the state which the cell is holding causes it to undergo NBTI/PBTI stress in such a way that it makes writing to the cell easier over time with aging.

By way of example, if the bias state and transistors in FIG. 3 are considered, the transistor PL 20 is holding a strong "1" at node 1 60. Similarly, transistor NR 35 is holding a strong "0" at node 2 65. These two transistors are strong and hence it is difficult for the AL and AR transistors 10, 40 to force a new state, as they would be trying to do during a write operation where bitline 50 is at a logic zero level and bitline 55 is at a logic one level. However, due to the way NBTI and PBTI work, the PL and NR transistors 20, 35 are undergoing NBTI and PBTI stress respectively. Due to these BTI stresses, the threshold voltage (Vt) of the PL and NR transistors will go up over time. The increase in Vt will make the PL and NR transistors weaker, thus making it easier to flip the state of the cell during the write operation. It should be noted that the NL and PR transistors 30, 25 do not have any BTI degradation in the state shown in FIG. 3, but would do so if the opposite state were strongly stored in the cell.

This potentially beneficial effect of BTI stress was recognised in the article by J. Wang et al entitled "Improving SRAM Vmin and Yield by Using Variation-Aware BTI Stress," IEEE Custom Integrated Circuits Conference, September 2010. The key idea in this article is to use the power-up state to provide an indication of mismatch in unbalanced memory cells and then use the power-up state as a BTI stress pattern. However, a potential problem with this approach is that even a minor mismatch in transistor strengths can cause a bit cell to power up in a particular state, but this does not mean that the cell needs to be stressed or improved. Hence, while more imbalanced cells may be healed by the BTI stress pattern, the originally more balanced cells may be deteriorated by over-stress. Although the paper seeks to limit this possibility by periodic re-power up of the device, there is still a significant likelihood that the process will cause detrimental effects in various cells, particularly those that were reasonably balanced prior to the BTI stress process being initiated.

Accordingly it would be desirable to provide an improved technique for altering the distribution of a chosen characteristic of a plurality of memory cells forming a memory device, such a characteristic for example being a minimum voltage required for a write operation.

SUMMARY OF THE INVENTION

Viewed from a first aspect, the present invention provides a method of altering distribution of a chosen characteristic of a plurality of memory cells forming a memory device, comprising: identifying a subset of said plurality of memory cells whose value of said chosen characteristic is within a predetermined end region of said distribution; performing a burn-in process during which one or more operating parameters of the memory device are set to induce ageing of said memory cells; during the burn-in process, for each memory cell in said subset, fixing the value stored in that memory cell to a selected value which exposes that memory cell to a stress condition; and during the burn-in process, for each memory cell not in said subset, alternating the value stored in that memory cell in order to alleviate exposure of that memory cell to said stress condition.

In accordance with the technique of the present invention, memory cells are treated differently dependent on where they reside within the distribution of a chosen characteristic. In particular, those memory cells whose value of the chosen characteristic is within a predetermined end region of the distribution have their value fixed during the burn-in process, whilst all of the other memory cells have their value alternated during the burn-in process. Hence, the memory cells whose value of the chosen characteristic is within the predetermined end region of the distribution are stressed in a DC condition during the burn-in process (due to their stored value remaining the same), whilst all of the other memory cells are placed in an AC condition (where their stored value keeps changing) in order to alleviate exposure of those memory cells to the stress condition.

Such a process serves to tighten the distribution of the chosen characteristic, with the burn-in process causing the number of memory cells within the subset to reduce during the burn-in process due to the exposure of those cells to the stress condition, whilst also ensuring that the memory cells that were not in the subset have a reduced exposure to the stress condition.

The chosen characteristic whose distribution is altered by the method of the present invention can take a variety of forms. In one embodiment, the chosen characteristic is a minimum voltage that allows a memory cell to be written to; and the predetermined end region comprises minimum voltage values exceeding a desired minimum voltage value, such that said subset determined in said identifying step comprises those memory cells that require a larger minimum voltage value than the desired minimum voltage value in order to change a value held in that memory cell during a write operation. By exposing such memory cells to the stress condition, their minimum write voltage values can be reduced during the course of the burn-in process, thereby allowing an overall lowering of the minimum voltage that needs to be used for the memory device when performing a write operation.

In one embodiment, each memory cell in the subset is unbalanced, so as to be biased towards storage of a favoured data value over a non-favoured data value, and requires a larger minimum voltage value than the desired minimum voltage value in order to change the value held in that memory cell during a write operation from said favoured data value to said non-favoured data value.

In one such embodiment, during the burn-in process, said fixing step comprises, for each memory cell in said subset, fixing the value stored in that memory cell to its favoured data value to expose to said stress condition the components within the memory cell that cause that memory cell to be biased towards storage of said favoured data value. As a result, each memory cell in the subset becomes less biased towards the storage of the favoured data value, and writeability of those cells is hence improved. It will be appreciated that the favoured data value will typically vary between memory cells in the subset, such that some of the memory cells in the subset are fixed to a logic 1 value where that is the favoured data value, whilst other memory cells in the subset are fixed to a logic 0 value where that is the favoured data value for those cells.

In an alternative embodiment, the chosen characteristic is a minimum voltage that allows a memory cell to retain a currently stored data value; and the predetermined end region comprises minimum voltage values exceeding a desired minimum voltage value, such that said subset determined in said identifying step comprises those memory cells that require a larger minimum voltage value than the desired minimum voltage value in order to avoid corruption of the currently stored data value. Hence, in such embodiments, through use of the present technique, it is possible to reduce the voltage that is required to be applied to the memory device when seeking to retain state within the memory cells of the memory device, since those memory cells that were limiting the minimum voltage are exposed during the burn-in process to a stress condition which reduces their voltage requirements.

As with the earlier example where the chosen characteristic was a minimum write voltage, when the chosen characteristic is a minimum retention voltage, each memory cell in the subset can be fixed to its favoured data value during the burn-in process, in order to expose to the stress condition the components within that memory cell that caused that memory cell to be biased towards retention of the favoured data value.

In a further alternative embodiment, the chosen characteristic is a read speed with which a read of a data value stored in a memory cell takes place; and the predetermined end region comprises read speed values exceeding a desired read speed, such that said subset determined in said identifying step comprises those memory cells that can be read more quickly than the desired speed.

In a memory device, the sense amplifier circuits that determine current contents of addressed memory cells during a read operation by sensing changes in voltage on the read bit line(s) have their timing set having regards to the slowest cell in the memory device, and accordingly no real performance benefit can be extracted from cells that can be read more quickly, i.e. that would have produced the necessary change on the bit line earlier than the time at which that change is sensed by the sense amplifier. However, the cells that can be read more quickly are also the cells that contribute most significantly to leakage current. By exposing to the stress condition those memory cells that can be read more quickly than the desired speed, this will cause the read speed of those cells to be reduced, thereby reducing leakage current.

The read speed of each memory cell will depend on the data value stored therein, each memory cell in the subset having a read speed that exceeds the desired read speed when the data value stored therein is a particular value. In one embodiment, during the burn-in process, said fixing step comprises, for each memory cell in said subset, fixing the value stored in that memory cell to the particular value that caused that memory cell to have a read speed that exceeds the desired read speed, in order to expose to said stress condition the components within the memory cell that cause that memory cell to have a read speed exceeding the desired read speed.

Such an approach can give rise to significant reduction in leakage current, by reducing the read speed of those memory cells that otherwise can be read more quickly than necessary having regard to the sense amplifier timing.

The burn-in operation can be performed in a variety of ways. However, in one embodiment, the burn-in process is performed by iterative execution of a burn-in operation, each iteration of the burn-in operation comprising: fixing the value stored in each memory cell of said subset to said selected value; randomly assigning values to each memory cell not in said subset; and maintaining for a selected time period said one or more operating parameters of the memory device at a level to induce ageing of said memory cells.

In one such embodiment, the method further comprises: performing an evaluation step after the burn-in operation has been repeated a selected number of times; said evaluation step comprising a re-determination of the subset of said plurality of memory cells whose value of said chosen characteristic is within the predetermined end region of said distribution; and if a predetermined condition exists, repeating the burn-in process using the subset as re-determined during said evaluation step.

Hence, through such an approach, the identification of the memory cells whose value of the chosen characteristic is within the predetermined end region is re-evaluated periodically throughout the burn-in process, with the expectation that the number of such memory cells will reduce over time, and accordingly the subset that is exposed to the stress condition will reduce over time.

The evaluation step can in one embodiment be performed after every iteration of the burn-in operation (i.e. the selected number of times is 1). However, in another embodiment, the burn-in operation is repeated multiple times between each evaluation step, with the memory cells not in the subset have their assigned values changed during each iteration of the burn-in operation. Hence, by the time each evaluation step is performed, the memory cells in the subset will have had their value fixed for a relatively long period of time, whilst the values in the other memory cells have been caused to flip state on multiple occasions.

Whilst in one embodiment, each execution of the burn-in operation involves the memory cells not in said subset having the values randomly assigned, in an alternative embodiment, such random assignment may be arranged to occur only on the first iteration of the burn-in operation, with all subsequent iterations of the burn-in operation prior to an evaluation step involving flipping the value held in each memory cell not in each subset. Hence, between each evaluation step, those memory cells not in the subset initially have their value randomly assigned, and then have their values flipped thereafter during each iteration of the burn-in operation.

The predetermined condition that, if present, causes the burn-in process to be repeated can take a variety of forms. However, in one embodiment the predetermined condition exists if there are still any memory cells within said subset re-determined during said evaluation step.

Hence, in such embodiments, the burn-in process will typically continue until there are no longer any memory cells having a value of the chosen characteristic within the initial predetermined end region.

However, in one embodiment, the predetermined condition is determined no longer to exist if a maximum time period has elapsed since the burn-in process was first performed. Accordingly, an upper time limit is placed on the burn-in process in accordance with such embodiments.

The operating parameters that are set to induce aging of the memory cells during the burn-in process can take a variety of forms. However, in one embodiment such operating parameters comprise at least one of supply voltage and operating temperature. Accordingly, by increasing the supply voltage and/or increasing the operating temperature during the burn-in process, the aging of the memory cells will be accelerated.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
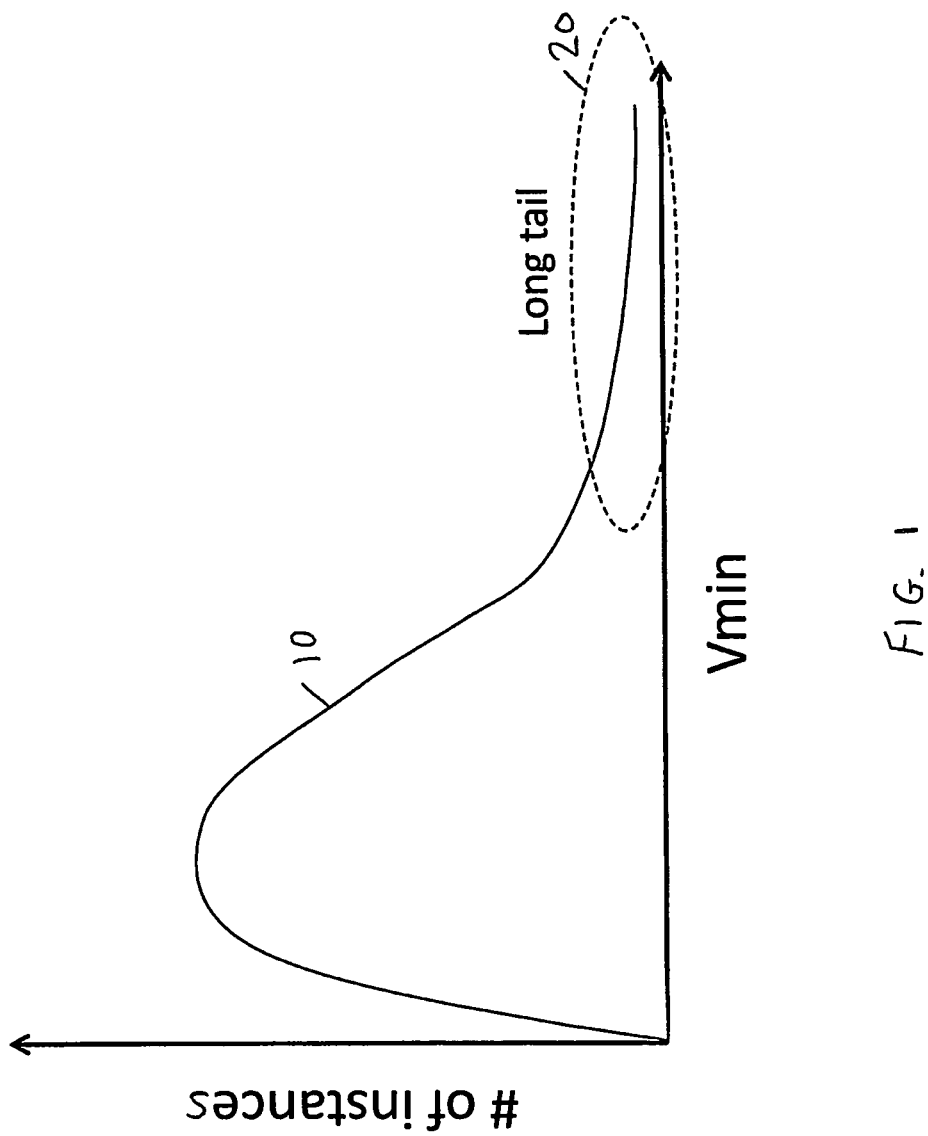
FIG. 1 is a graph illustrating a typical Vmin distribution in an SRAM memory array.
Figure 4:
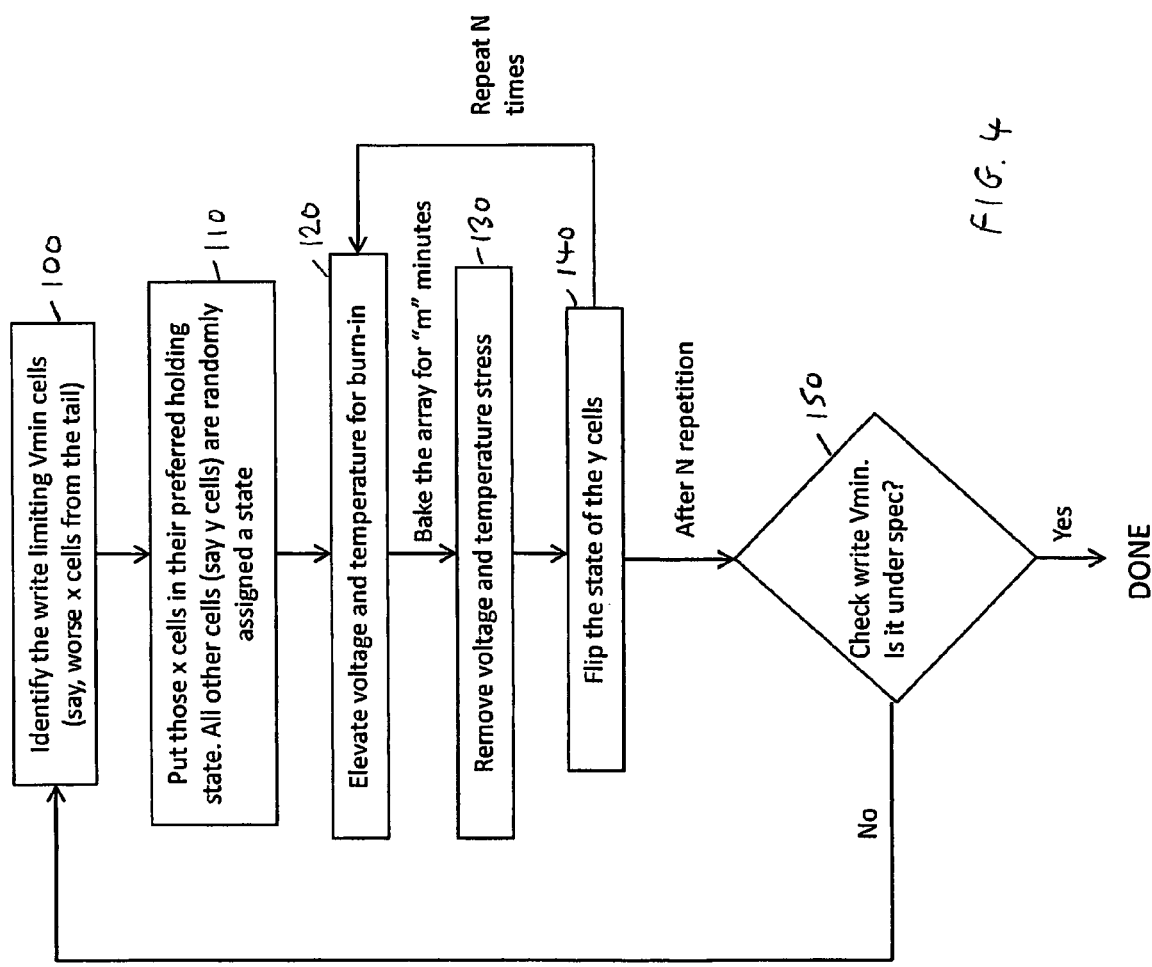
FIG. 4 is a flow diagram illustrating a burn-in process in accordance with one embodiment.

FIG. 4 is a flow diagram illustrating a method for altering the distribution of the write Vmin of a plurality of memory cells forming a memory device, in accordance with one embodiment. At step 100, those memory cells of the device that are limiting the write Vmin are identified. As will be appreciated from the earlier discussion of FIG. 1, these will be those cells whose values of write Vmin appear in the tail region 20 of the distribution. Accordingly, via step 100 a subset of the memory cells whose value of write Vmin is within a predetermined end region of the distribution are identified. This may be done either by identifying the worst x cells from the tail, where x is a predetermined number, or by choosing a desired minimum write Vmin, and choosing as the subset those cells with a write Vmin exceeding that desired minimum write Vmin (in this case the actual value of x depending on the form of the distribution relative to the desired minimum voltage).

There are a number of ways of performing the identification step 100. In one embodiment, the following sequence of steps can be performed:

1 Write a bit pattern at one address using a nominal voltage (eg VDD).
2 Read the address at the nominal voltage, and match the read data with the write data written at step one.
3 Reduce the supply voltage and write the same data to the same address.
4 Read the address at the nominal voltage, and determine if the read data matches the data that was written.
5 For each bit cell, record as Vmin for that bit cell the supply voltage used at step 3 if the read data for that bit cell matches the data that was written to that bit cell.

Steps 3 to 5 are then repeated until failure is seen for each of the bit cells addressed. For each bit cell, the last Vmin value recorded at step 5 for that bit cell then identifies the Vmin for the given bit cell for the given data value written into that cell.

However, write Vmin for a bit cell is defined as the lowest possible supply voltage at which the cell can be written, and this may be dependent on the data value that is actually written into the cell. Accordingly, having performed the above process, the data pattern is then inverted in step 1, and steps 1-5 are repeated again until all of the bit cells fail. This hence provides the Vmin for each bit cell for the other data value, and hence the write Vmin for a particular memory cell will be the maximum of the two Vmin values determined for that cell by the above steps.

In a similar manner, steps 1-5 are repeated for all of the addresses of the memory array, and as a result, the write-limiting Vmin for every bit cell in the array can be identified.

Having identified the x cells forming the subset of memory cells whose value of write Vmin is within the predetermined end region of the distribution, the process proceeds to step 110 where those x cells are placed into their preferred holding state. As discussed earlier, the memory cells in the predetermined end region will be unbalanced, so as to be biased towards storage of a favoured data value over an unfavoured data value, and the write Vmin for each such cell will be determined by the minimum voltage required to change the value held in that memory cell during a write operation from its favoured data value to its non favoured data value. The favoured data value hence represents the preferred holding state.

In addition to placing the x cells into their preferred holding state, all other cells of the memory array (referred to herein as the y cells) are randomly assigned a state at step 110.

Thereafter, at step 120, the voltage supply and the operating temperature are elevated in order to perform burn-in of the memory cells, the elevated operating voltage and operating, temperature serving to induce aging of the memory cells. This burn-in stage 120 is then maintained for a period of time, in the example of FIG. 4 this time being a predetermined number of minutes m. Thereafter, at step 130, the operating voltage and temperature is reduced back to the normal level (e.g. nominal voltage supply level and room temperature) in order to remove the stress condition placed on the memory cells by the burn-in stage 120.

Thereafter, at step 140, the state within the y cells is flipped, and the process returns to step 120. By flipping the state of the y cells prior to returning to step 120, this alleviates the exposure of those memory cells to the stress condition imposed by the burn-in process.

Steps 120, 130, 140 are repeated a predetermined number of times, in the example of FIG. 4 this being N times. After N repetitions of steps 120-140, the process proceeds to step 150, where the write Vmin distribution is then checked. Considering the embodiment where a desired minimum write Vmin is specified, this process may involve performing a series of write and read operations to the memory array, where the write operations are performed at the desired minimum write Vmin, and the read operations are performed at nominal voltage to ensure that the read operations are performed correctly. This is performed until every bit cell has been written with both a logic 1 value and a logic 0 value, and if any of the memory cells do not produce a match when their contents are read, this will indicate that there are still memory cells that require a larger write Vmin than the desired write Vmin.

In one embodiment, if that condition is determined to still exist, the process returns to step 100 where the subset of memory cells whose value of write Vmin is still within the predetermined end region are determined. It would be expected over time that the number of cells x would reduce each time step 100 is performed, due to the effects of the stress condition applied to the relevant cells during the previous application of steps 110-140. Accordingly, after a number of iterations of the process of FIG. 4, it would be expected that when the write Vmin check was performed at step 150, it would be determined that there were no longer any memory cells whose write Vmin exceeded the desired write Vmin, at which point the process completes.

However, it will be appreciated that the decision as to whether the memory device is now within acceptable bounds (and accordingly the burn-in process can be stopped), can be varied dependant on implementation. For example, whilst a desired write Vmin may be specified, there may be a predetermined time out condition, such that if a maximum time period has elapsed since the burn-in process was first started without all memory cells then having a write Vmin equal to or less than the desired write Vmin, then it may still be determined to exit the process at step 150. It will be appreciated that improvements will still have been made, since the required write Vmin will have been reduced by virtue of the stress condition applied to the memory cells in the tail region.

Figure 5:
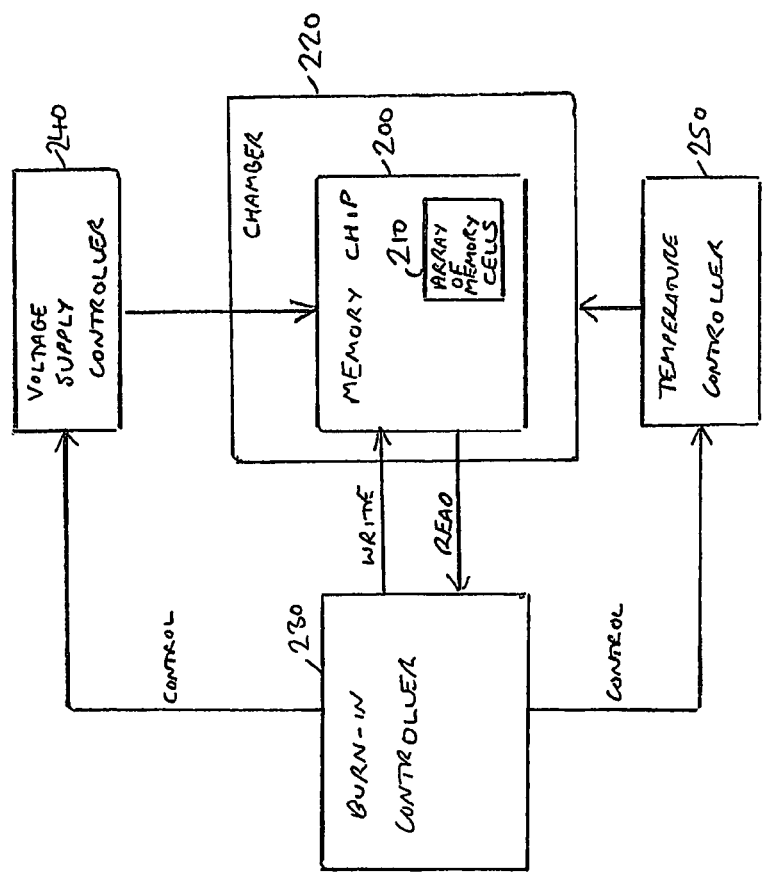
FIG. 5 is a block diagram illustrating a system in which the burn-in process of embodiments may be performed.

There are a number of ways in which the process of FIG. 4 may be implemented. FIG. 5 illustrates an example system, where a memory chip 200 having an array of memory cells 210 is placed within a chamber 220 and then subjected to the method described in FIG. 4. In particular a burn-in controller 230, which in one example may be implemented by a computer executing a control program, is used to perform a sequence of write and read operations in respect of the memory chip 200 in order to perform steps 100, 110, 140 and 150 of FIG. 4. In addition, the burn-in controller 230 will issue appropriate control signals to the voltage supply controller 240 and the temperature controller 250, to cause the operating voltage supplied to the memory chip 200 and the temperature within the chamber 250 to be elevated during the burn-in process of step 120, and for those stress-inducing voltages and temperature to then be removed at step 130.

Figure 6:
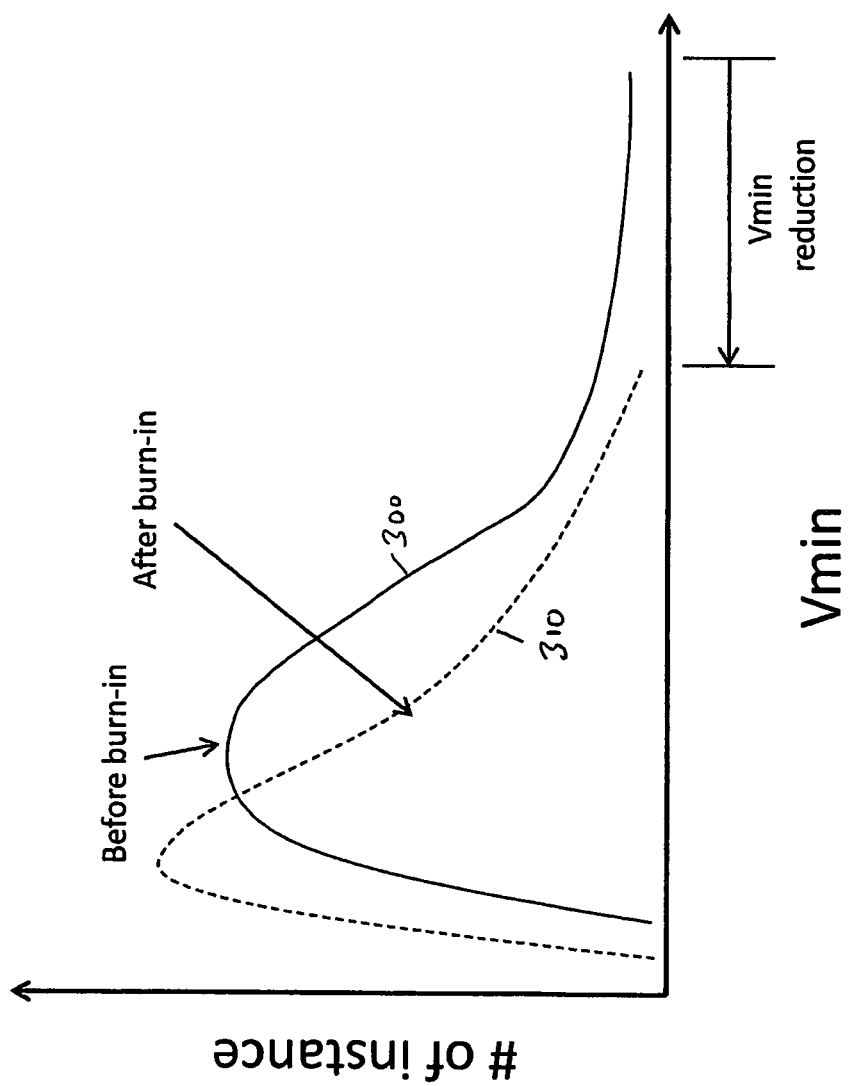
FIG. 6 is a graph illustrating how the distribution of the write Vmin characteristic is altered after application of the burn-in process of one embodiment.

FIG. 6 is a graph showing the change in distribution of write Vmin of an SRAM array before and after application of the selective data burn-in process of FIG. 4. As can be seen from FIG. 6, the burn-in process tightens the Vmin distribution, and in particular it can be seen that the tail region becomes shortened, and hence when the distribution 300 before burn-in is compared with the distribution 310 after burn-in it can be seen that a significant reduction in the write Vmin has been achieved.

One side effect of BTI is that it can degrade read current (mainly due to the PBTI stress applied to NMOS transistors within the latch of the memory cell). Hence, whilst BTI stress improves writeability it can make the readability worse. Thus, if the same bit cell is the worst case bit cell for both write and read operations, the scheme will improve the writeability of that bit cell but may worsen its readability. However, for a large SRAM array, statistically the probability of having the same bit cell being the worst case bit cell for both read and write operations is extremely low. Furthermore, in modern day systems, the write Vmin is typically larger than the read Vmin, and hence it is the write Vmin that tends to constrain the overall minimum voltage supply that can be used for the memory array. The above described technique can significantly improve the memory cells within the tail region of the write Vmin distribution, thus enabling a significant reduction in the write Vmin. Whilst the read Vmin of certain cells may increase, the increased read Vmin will still typically be below the lowered write Vmin, thereby enabling a reduction in the overall minimum supply voltage required for the memory array.

From the above discussion, it will be appreciated that due to the burn-in process with selectively chosen data values for memory cells in the tail region, the writeability of those memory cells improves, and accordingly the write Vmin becomes smaller. For the memory cells not in the tail region, their cell states are repeatedly flipped during the burn-in process to ensure equal degradation in all transistors, thus making sure that they do not become the write limiting cells.

Whilst in one embodiment, the process of the present invention is applied in order to reduce write Vmin of memory cells, the same process can also be applied to tighten the distribution of other characteristics of the memory cells. For example, in one embodiment, the chosen characteristic may be a minimum voltage which allows a memory cell to retain a currently stored data value. It will be appreciated that in modern day systems, it is often the case that a memory array is placed into a retention state, where a lower than normal voltage is applied to the memory cells sufficient to enable them to retain a currently stored data value. However, the distribution of that minimum voltage will follow a similar profile to the write Vmin distribution profile, and accordingly there will be a number of memory cells that are responsible for a tail region of the distribution, this limiting the minimum voltage that can be used for data retention. The same process of FIG. 4 can be used to identify those retention limiting Vmin cells, and to cause those cells to store their favoured data value during the burn-in process in order to tighten the distribution. This hence enables the retention minimum voltage to be reduced.

Figure 2:
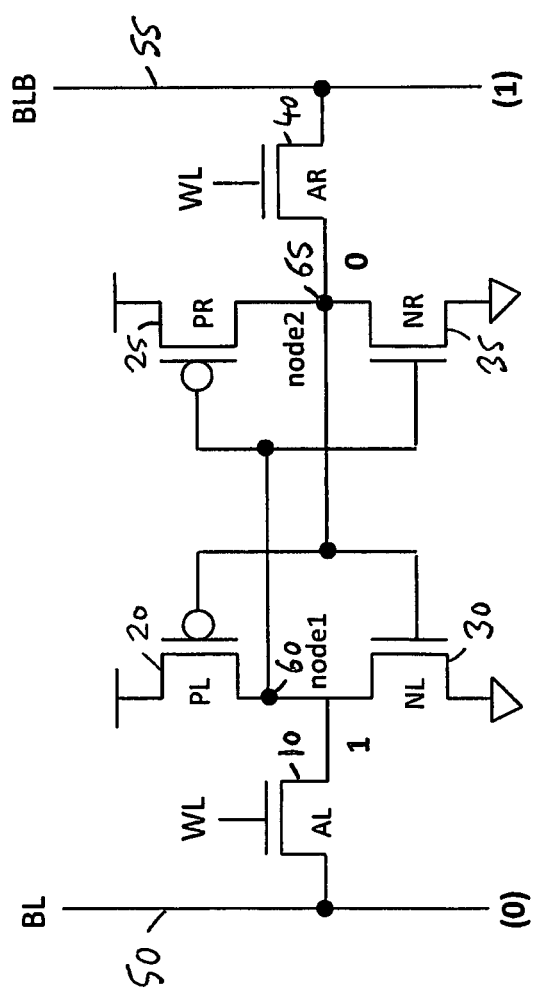
FIG. 2 illustrates a typical 6T memory cell.
Figure 3:
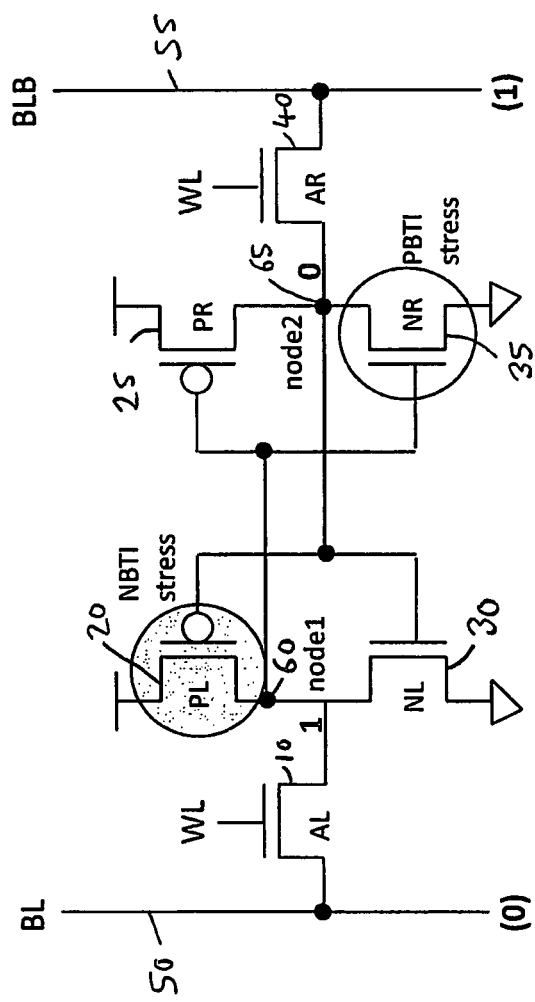
FIG. 3 illustrates how NBTI and PBTI stress can occur within certain transistors of the memory cell of FIG. 2.

As another example, the chosen characteristic may be read speed with which a read of a data value stored in a memory cell can take place. Referring back to FIG. 2, during the read operation, the bit cell is connected to the bit lines 50, 55, which are allowed to float. Accordingly, dependent on the value stored within the bit cell, one of the bit lines will begin to discharge towards a logic 0 value. Sense amplifier circuitry is arranged, at a certain timing after the start of the read operation, to sense the voltages on the bit lines, and based thereon to determine the value stored within the bit cell. Since the timing of the sense amplifier circuitry is determined having regards to the slowest read cell in the array, bit cells that discharge one of the bit lines more quickly than other cells produce no real performance benefit. However, the read cells that discharge the bit line more quickly (referred to herein as the bit cells that have a larger read speed) also contribute more significantly to leakage current within the memory device.

Accordingly, the technique described earlier can be applied in order to seek to reduce the leakage current of the memory device. In particular, at step 100 of FIG. 4, those memory cells that have a read speed that exceeds the desired read speed will be identified, and then at step 110 those x cells will have their value fixed to the particular value that gave rise to the read speed exceeding their desired read speed. The stress condition imposed at step 120 will then cause components within those memory cells that caused those memory cells to have a read speed exceeding the desired read speed to be exposed to the stress condition. After application of the process of FIG. 4, the read speed of those identified cells will be reduced, and as a result the overall leakage current of the memory device will be reduced.

Considering the performance of step 100 of FIG. 4 when seeking to reduce leakage current, the following four steps can be performed:

1 Write a bit pattern at one address using a nominal voltage (eg VDD).
2 Read the address at the nominal voltage, and match the read data with the write data.
3 Shift the sense amplifier enable timing to give less time to read.
4 Read the address at the nominal voltage again, and determine if the read data matches the write data Steps 3 and 4 are then repeated until a failure is observed for each bit cell. The sense amplifier timing for each of the bit cells at the point at which that bit cell failed is then recorded. This gives an indication of the read speed. Then the data pattern is inverted in step 1 and steps 1-4 are repeated until all of the bit cells fail again. This will provide an indication of the read speed for the other data pattern. Typically, memory cells contributing to the tail region of the distribution will be unbalanced, and will read significantly faster for one data value than for another data value, the read speed for each bit cell being defined as its quickest read speed. Steps 1-4 are repeated for all the addresses, and hence all of the memory cells which have a read speed exceeding the desired read speed can be identified.

From the above description, it will be appreciated that the above described embodiments provide a method for altering the distribution of a chosen characteristic of a plurality of memory cells forming a memory device, using a burn-in process where memory cells whose value of the chosen characteristic is within a predetermined end region of the distribution are stressed in a DC condition (i.e. with their value fixed), whereas all other memory cells are subjected to an AC condition (where the store value is repetitively flipped to alleviate exposure of those memory cells to the stress condition). This process leads to a tightening of the distribution, improving the operating characteristics of the memory device.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A method of altering distribution of a chosen characteristic of a plurality of memory cells forming a memory device, comprising:
    identifying a subset of said plurality of memory cells whose value of said chosen characteristic is within a predetermined end region of said distribution;
    performing a burn-in process during which one or more operating parameters of the memory device are set to induce ageing of said memory cells;
    during the burn-in process, for each memory cell in said subset, fixing the value stored in that memory cell to a selected value which exposes that memory cell to a stress condition; and
    during the burn-in process, for each memory cell not in said subset, alternating the value stored in that memory cell in order to alleviate exposure of that memory cell to said stress condition, wherein:
    said chosen characteristic is a read speed with which a read of a data value stored in a memory cell takes place; and
    the predetermined end region comprises read speed values exceeding a desired read speed, such that said subset determined in said identifying step comprises those memory cells that can be read more quickly than the desired speed.

2. A method as claimed in claim 1, wherein:
    said chosen characteristic is a minimum voltage that allows a memory cell to be written to; and
    the predetermined end region comprises minimum voltage values exceeding a desired minimum voltage value, such that said subset determined in said identifying step comprises those memory cells that require a larger minimum voltage value than the desired minimum voltage value in order to change a value held in that memory cell during a write operation.

3. A method as claimed in claim 2, wherein each memory cell in said subset is unbalanced, so as to be biased towards storage of a favoured data value over a non-favoured data value, and requires the larger minimum voltage value than the desired minimum voltage value in order to change the value held in that memory cell during a write operation from said favoured data value to said non-favoured data value.

4. A method as claimed in claim 3, wherein, during said burn-in process, said fixing step comprises, for each memory cell in said subset, fixing the value stored in that memory cell to its favoured data value to expose to said stress condition the components within the memory cell that cause that memory cell to be biased towards storage of said favoured data value.

5. A method as claimed in claim 1, wherein:
    said chosen characteristic is a minimum voltage that allows a memory cell to retain a currently stored data value; and
    the predetermined end region comprises minimum voltage values exceeding a desired minimum voltage value, such that said subset determined in said identifying step comprises those memory cells that require a larger minimum voltage value than the desired minimum voltage value in order to avoid corruption of the currently stored data value.

6. A method as claimed in claim 5, wherein each memory cell in said subset is unbalanced, so as to be biased towards retention of a favoured data value over a non-favoured data value, and requires the larger minimum voltage value than the desired minimum voltage value in order to retain as the currently stored data value the non-favoured data value.

7. A method as claimed in claim 6, wherein, during said burn-in process, said fixing step comprises, for each memory cell in said subset, fixing the value stored in that memory cell to its favoured data value to expose to said stress condition the components within the memory cell that cause that memory cell to be biased towards retention of said favoured data value.

8. A method as claimed in claim 1, wherein:
    the read speed of each memory cell depends on the data value stored therein, each memory cell in said subset having a read speed that exceeds the desired read speed when the data value stored therein is a particular value; and
    during said burn-in process, said fixing step comprises, for each memory cell in said subset, fixing the value stored in that memory cell to the particular value that caused that memory cell to have a read speed that exceeds the desired read speed, in order to expose to said stress condition the components within the memory cell that cause that memory cell to have a read speed exceeding the desired read speed.

9. A method as claimed in claim 1, wherein said one or more operating parameters comprise at least one of supply voltage and operating temperature.

10. A method of altering distribution of a chosen characteristic of a plurality of memory cells forming a memory device, comprising:
- identifying a subset of said plurality of memory cells whose value of said chosen characteristic is within a predetermined end region of said distribution;
- performing a burn-in process during which one or more operating parameters of the memory device are set to induce ageing of said memory cells;
- during the burn-in process, for each memory cell in said subset, fixing the value stored in that memory cell to a selected value which exposes that memory cell to a stress condition; and
- during the burn-in process, for each memory cell not in said subset, alternating the value stored in that memory cell in order to alleviate exposure of that memory cell to said stress condition, wherein the burn-in process is performed by iterative execution of a burn-in operation, each iteration of the burn-in operation comprising:
- fixing the value stored in each memory cell of said subset to said selected value;
- randomly assigning values to each memory cell not in said subset; and
- maintaining for a selected time period said one or more operating parameters of the memory device at a level to induce ageing of said memory cells.

11. A method of altering distribution of a chosen characteristic of a plurality of memory cells forming a memory device, comprising;
- identifying a subset of said plurality of memory cells whose value of said chosen characteristic is within a predetermined end region of said distribution;
- performing a burn-in process during which one or more operating parameters of the memory device are set to induce ageing of said memory cells;
- during the burn-in process, for each memory cell in said subset, fixing the value stored in that memory cell to a selected value which exposes that memory cell to a stress condition; and
- during the burn-in process, for each memory cell not in said subset, alternating the value stored in that memory cell in order to alleviate exposure of that memory cell to said stress condition wherein the burn-in process is performed by iterative execution of a burn-in operation, each iteration of the burn-in operation comprising:
- fixing the value stored in each memory cell of said subset to said selected value;
- randomly assigning values to each memory cell not in said subset; and
- maintaining for a selected time period said one or more operating parameters of the memory device at a level to induce ageing of said memory cells, further comprising:
- performing an evaluation step after the burn-in operation has been repeated a selected number of times;
- said evaluation step comprising a re-determination of the subset of said plurality of memory cells whose value of said chosen characteristic is within the predetermined end region of said distribution; and
- if a predetermined condition exists, repeating the burn-in process using the subset as re-determined during said evaluation step.

12. A method as claimed in claim 11, wherein said predetermined condition exists if there are still any memory cells within said subset re-determined during said evaluation step.

13. A method as claimed in claim 11, wherein said predetermined condition is determined no longer to exist if a maximum time period has elapsed since the burn-in process was first performed.

* * * * *